(12) United States Patent
Göötz et al.

(10) Patent No.: US 9,397,280 B2
(45) Date of Patent: Jul. 19, 2016

(54) METHOD OF PRODUCING AN OPTOELECTRONIC SEMICONDUCTOR CHIP

(71) Applicant: OSRAM Opto Semiconductors GmbH, Regensburg (DE)

(72) Inventors: Britta Göötz, Regensburg (DE); Jürgen Moosburger, Regensburg (DE); Andreas Plößl, Regensburg (DE); Matthias Sabathil, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 14/383,177

(22) PCT Filed: Feb. 14, 2013

(86) PCT No.: PCT/EP2013/052995
§ 371 (c)(1),
(2) Date: Sep. 5, 2014

(87) PCT Pub. No.: WO2013/131729
PCT Pub. Date: Sep. 12, 2013

(65) Prior Publication Data
US 2015/0048400 A1      Feb. 19, 2015

(30) Foreign Application Priority Data

Mar. 6, 2012   (DE) .......................... 10 2012 101 889

(51) Int. Cl.
*H01L 33/64* (2010.01)
*H01L 33/00* (2010.01)
(Continued)

(52) U.S. Cl.
CPC .............. *H01L 33/641* (2013.01); *C23C 24/04* (2013.01); *C25D 7/12* (2013.01); *H01L 33/0079* (2013.01); *H01L 33/46* (2013.01); *H01L 33/644* (2013.01); *H01L 2924/0002* (2013.01);
(Continued)

(58) Field of Classification Search
None
See application file for complete search history.

(56) References Cited

U.S. PATENT DOCUMENTS

2006/0108601 A1   5/2006   Okamoto
2007/0176194 A1   8/2007   Wakamatsu et al.
(Continued)

FOREIGN PATENT DOCUMENTS

CN          101965649 A        2/2011
DE    10 2007 022 947 A1      10/2008
(Continued)

OTHER PUBLICATIONS

Machine translation of Mayuko (JP 2010-027643), Feb. 2010.*
(Continued)

*Primary Examiner* — Yasser A Abdelaziez
(74) *Attorney, Agent, or Firm* — DLA Piper LLP (US)

(57) ABSTRACT

A method of producing an optoelectronic semiconductor chip includes growing an optoelectronic semiconductor layer sequence on a growth substrate, forming an electrically insulating layer on a side of the optoelectronic semiconductor layer sequence facing away from the growth substrate by depositing particles of an electrically insulating material by an aerosol deposition method, and at least partly removing the growth substrate after forming the electrically insulating layer.

19 Claims, 7 Drawing Sheets

(51) Int. Cl.
  *C23C 24/04* (2006.01)
  *C25D 7/12* (2006.01)
  *H01L 33/46* (2010.01)

(52) U.S. Cl.
  CPC .. *H01L 2933/005* (2013.01); *H01L 2933/0025* (2013.01); *H01L 2933/0075* (2013.01)

(56) References Cited

U.S. PATENT DOCUMENTS

| | | | |
|---|---|---|---|
| 2008/0035949 | A1 | 2/2008 | Fudeta et al. |
| 2010/0155738 | A1 | 6/2010 | Nabeta et al. |
| 2011/0095325 | A1* | 4/2011 | Lu .................. H01L 33/387 257/98 |

FOREIGN PATENT DOCUMENTS

| | | | |
|---|---|---|---|
| JP | 2004241203 | * | 2/2004 |
| JP | 2006-165498 | A | 6/2006 |
| JP | 2006-179856 | | 7/2006 |
| JP | 2007-266303 | | 10/2007 |
| JP | 2007-314889 | | 12/2007 |
| JP | 2008-66704 | | 3/2008 |
| JP | 2008-153340 | | 7/2008 |
| JP | 2009-086370 | | 4/2009 |
| JP | 2009-188844 | | 8/2009 |
| JP | 2010-27643 | | 2/2010 |
| JP | 2010-93186 | | 4/2010 |
| JP | 2010-123717 | | 6/2010 |
| JP | 2010-219310 | | 9/2010 |
| JP | 2010-272613 | A | 12/2010 |
| JP | 2011-23475 | | 2/2011 |
| JP | 2011-517125 | | 5/2011 |
| JP | 2011-222551 | | 11/2011 |
| KR | 2009-0072226 | A | 7/2009 |
| WO | 2011/006719 | A1 | 1/2011 |
| WO | 2011032853 | A1 | 3/2011 |

OTHER PUBLICATIONS

Machine translation of Toshiyuki et al. (JP 2011-023475), Feb. 2011.*
Machine translation of Furuse et al. (JP 2004-241203), Feb. 2004.*
English and German translations of Office Action dated Sep. 2, 2015 of corresponding Chinese Patent Application No. 201380013127.0.
I. Schnitzer et al., "30% external quantum efficiency from surface textured, thin-film light-emitting diodes," Applied Physics Letters, vol. 63, No. 16, Oct. 18, 1993, pp. 2174-2176.
R.H. Horng et al., "AlGaInP/AuBe/glass light-emitting diodes fabricated by water bonding technology," Applied Physics Letters, vol. 75, No. 2, Jul. 12, 1999, pp. 154-156.
R.H. Horng et al., "AlGaInP light-emitting diodes with mirror substrates fabricated by wafer bonding," Applied Physics Letters, vol. 75, No. 20, Nov. 15, 1999, pp. 3054-3056.
Jun Akedo, "Aerosol Deposition Method for Fabrication of Nano Crystal Ceramic Layer," Materials Science Forum, vols. 449-452, 2004, pp. 43-48 (Abstract).
Jun Akedo, "Aerosol Deposition of Ceramic Thick Films at Room Temperature: Densification Mechanism of Ceramic Layers," Journal of American Ceramic Society, vol. 89, No. 6, 2006, pp. 1834-1839.
Jun Akedo, "Room Temperature Impact Consolidation (RTIC) of Fine Ceramic Powder by Aerosol Deposition Method and Applications to Microdevices," Journal of Thermal Spray Technology, vol. 17, No. 2, Jun. 2008, pp. 181-198 (Abstract).
Hyun Min Cho et al., "Metal-Core Printed Circuit Board With Alumina Layer by Aerosol Deposition Process," IEEE Electron Devices Letters, vol. 29, No. 9, Sep. 2008, pp. 991-993.
English translation of the Japanese Notice of Reasons for Rejection dispatched Jul. 7, 2015 from corresponding Japanese Patent Application No. 2014-557041.
English translation of the Decision of Rejection dated Jan. 5, 2016 of corresponding Japanese Application No. 2014-557041.

* cited by examiner

METHOD OF PRODUCING AN OPTOELECTRONIC SEMICONDUCTOR CHIP

TECHNICAL FIELD

This disclosure relates to a method of producing an optoelectronic semiconductor chip and an optoelectronic semiconductor chip.

BACKGROUND

Light-emitting diode chips are known in which a light-emitting semiconductor layer sequence is transferred from a growth substrate to a replacement carrier, which is often electrically insulated from the semiconductor layer sequence.

Hitherto, two approaches have been pursued for the electrical insulation of the optoelectronically active light-emitting diode structure and the connection area for chip mounting, namely either the use of insulating material as a replacement carrier or the use of an electrically insulating intermediate layer. These approaches, therefore, require either a joining step or the deposition of an insulating layer from the gas phase.

When an insulating material is used as a replacement carrier, R. Horng et al., AlGaInP/AuBe/glass light-emitting diodes fabricated by wafer bonding technology, Applied Physics Letters 75, 154-156, 1999, for example, proposes using glass as an electrically insulating replacement carrier, which is coated with an AuBe layer and bonded at 450° C. during 15 minutes onto the p+-type contact composed of GaAs of an AlGaInP semiconductor layer sequence. Such a joining step is carried out at an elevated temperature under all practically relevant circumstances, which either restricts the choice of the insulating material to be joined to substances having a suitable thermal expansion which matches the growth substrate, or requires complex low-temperature joining processes to avoid damage on account of thermomechanical strains that can arise from the different contraction behavior of the growth substrate and of the insulating material of the replacement carrier.

When an electrically insulating intermediate layer is used, the light-emitting semiconductor layer sequence is electrically insulated from an electrically conductive replacement carrier. By way of example, R. Horng et al., AlGaInP light emitting diodes with mirror substrates fabricated by wafer bonding, Applied Physics Letters 75, 3054-3056, 1999, describes the use of an Si wafer with a 300 nm thick $SiO_2$ layer produced by thermal oxidation such that the Si wafer as a replacement carrier can be bonded against the p+-type contact composed of GaAs of an AlGaInP light-emitting diode in an electrically insulated manner at 300° C. during 20 minutes by AuBe as an adhesion-promoting metal layer. If, in contrast thereto, an electrically insulating intermediate layer is intended to be deposited from the gas phase, then in practice this is restricted to extremely thin layers with which reliable insulation can hardly be achieved, since the electrically insulating layer itself either does not exhibit sufficient breakdown strength or else cannot effectively prevent a flashover between the adjacent conductive layers at the chip edge.

It could therefore be helpful to provide a method of producing an optoelectronic semiconductor chip and an optoelectronic semiconductor chip.

SUMMARY

We provide a method of producing an optoelectronic semiconductor chip including growing an optoelectronic semiconductor layer sequence on a growth substrate, forming an electrically insulating layer on a side of the optoelectronic semiconductor layer sequence facing away from the growth substrate by depositing particles of an electrically insulating material by an aerosol deposition method, and at least partly removing the growth substrate after forming the electrically insulating layer.

We also provide an optoelectronic semiconductor chip including a semiconductor layer sequence on a mirror layer, wherein a metal layer is arranged on a side of the mirror layer facing away from the semiconductor layer sequence, and the mirror layer and the metal layer are enclosed by an electrically insulating layer applied by an aerosol deposition method.

DETAILED DESCRIPTION

In our method of producing an optoelectronic semiconductor chip, a growth substrate is provided on which an optoelectronic semiconductor layer sequence is grown. Particularly preferably, the semiconductor layer sequence can be grown on a growth substrate by an epitaxy method, for example, metal organic vapor phase epitaxy (MOVPE) or molecular beam epitaxy (MBE).

The optoelectronic semiconductor chip can be a light-emitting semiconductor chip, for example, in the form of a light-emitting diode chip or a laser diode chip, or a light-detecting semiconductor chip, for example, in the form of a photodiode chip or a photovoltaic cell. The optoelectronic semiconductor chip can comprise an optoelectronic semiconductor layer sequence on the basis of different semiconductor material systems, depending on the wavelength. For example, a semiconductor layer sequence on the basis of $In_xGa_yAl_{1-x-y}As$ is suitable for a longwave, infrared to red radiation, for example, a semiconductor layer sequence on the basis of $In_xGa_yAl_{1-x-y}P$ is suitable for red to yellow radiation and, for example, a semiconductor layer sequence on the basis of $In_xGa_yAl_{1-x-y}N$ is suitable for short-wave visible, that is to say in particular for green to blue, radiation and/or for UV radiation, wherein $0 \leq x \leq 1$ and $0 \leq y \leq 1$ hold true in each case. Furthermore, an optoelectronic semiconductor layer sequence based on an antimonide, for example, InSb, GaSb, AlSb or a combination thereof, can be suitable for longwave infrared radiation.

The growth substrate can comprise an insulator material or a semiconductor material, for example, a compound semiconductor material system mentioned above. In particular, the growth substrate can comprise sapphire, GaAs, GaP, GaN, InP, SiC, Si and/or Ge or can be composed of such a material.

The optoelectronic semiconductor layer sequence can comprise an active region, for example, a conventional pn junction, a double heterostructure, a single quantum well structure (SQW structure) or a multi quantum well structure (MQW structure). The designation "quantum well structure" encompasses in particular any structure in which charge carriers can experience a quantization of their energy states as a result of confinement. In particular, the designation quantum well structure does not include any indication about the dimensionality of the quantization. It therefore encompasses, inter alia, quantum wells, quantum wires and quantum dots and any combination of these structures. The semiconductor layer sequence can comprise, besides the active region, further functional layers and functional regions, for instance p- or n-doped charge carrier transport layers, undoped or p- or n-doped confinement, cladding or waveguide layers, barrier layers, planarization layers, buffer layers, protective layers and/or electrodes and combinations thereof. The structures described here relating to the active region or the further functional layers and regions are known in particular with regard to construction, function and structure and therefore will not be explained in any greater detail at this juncture.

Furthermore, one or a plurality of mirror layers can be applied, for example, on a side of the semiconductor layer sequence facing away from the growth substrate. In particular, the one mirror layer or the plurality of mirror layers can comprise of a metal, particularly preferably silver. Furthermore, combinations of layers comprising one or a plurality of transparent conductive oxides and comprising one or a plurality of mirror metals or comprising one or a plurality of transparent dielectric materials and comprising one or a plurality of mirror metals are also possible as the mirror layer.

The growth process can take place in the wafer assemblage, in particular. In other words, a growth substrate in the form of a wafer is provided, onto which the optoelectronic semiconductor layer sequence is grown over a large area. The optoelectronic semiconductor layer sequence grown can be singulated into individual semiconductor chips in a further method step.

Furthermore, preferably before singulation the semiconductor layer sequence is transferred to a carrier element and the growth substrate can be thinned, that is to say at least partly or completely removed. The carrier element is then singulated together with the semiconductor layer sequence, for example, to form light-emitting or light-absorbing semiconductor chips or solar cells. Semiconductor chips comprising a carrier element as carrier substrate instead of the growth substrate can also be designated as so-called "thin-film semiconductor chips," also as "thin-film light-emitting diode chips" in the case of light-emitting thin-film semiconductor chips.

A thin-film light-emitting diode chip can be distinguished, in particular, by the following characteristic features:
  a reflective layer, in particular a mirror layer, is applied or formed at a first main area—facing toward the carrier substrate—of a light-emitting semiconductor layer sequence, the layer reflecting at least part of the electromagnetic radiation generated in the semiconductor layer sequence back into the latter;
  the semiconductor layer sequence has a thickness of 20 μm or less, in particular 4 μm to 10 μm; and
  the semiconductor layer sequence contains at least one semiconductor layer having at least one area having an intermixing structure which ideally leads to an approximately ergodic distribution of the light in the semiconductor layer sequence, that is to say that it has an as far as possible ergodically stochastic scattering behavior.

A thin-film light-emitting diode chip is a Lambertian surface emitter to a good approximation. The basic principle of a thin-film light-emitting diode chip is described, for example, in I. Schnitzer et al., Appl. Phys. Lett. 63 (16), Oct. 18, 1993, 2174-2176.

A semiconductor layer sequence which is a solar cell using thin-film technology or a light-absorbing thin-film semiconductor chip can likewise benefit from a mirror layer on the side facing the carrier element since the optical path length for the incident light can be increased and practically doubled. In multiple solar cells such as are discussed and tested for so-called "concentrator cells," as a result of the mirror layer, at least the cell closest to the carrier element, which cell typically has the smallest band gap, can benefit from the mirror layer. Since the mirror layer can double the path length available for absorption, this cell layer can be kept thinner. As a result, it can be possible that the total efficiency improves since thinner cells can be producible with better quality and can often also yield better voltage values.

Furthermore, electrical contact regions can be applied on the optoelectronic semiconductor layer sequence, by which contact regions electrical contact can be made with the optoelectronic semiconductor chip. The contact regions can be arranged on the same or on different sides of the optoelectronic semiconductor layer sequence in relation to the growth direction.

Furthermore, transferring the optoelectronic semiconductor layer sequence to a carrier element can comprise a method step wherein an electrically insulating layer is applied on a side of the optoelectronic semiconductor layer sequence facing away from the growth substrate, by deposition of particles of an electrically insulating material by an aerosol deposition method.

Preferably, a method of producing an optoelectronic semiconductor chip comprises the following steps:
  growing an optoelectronic semiconductor layer sequence on a growth substrate,
  forming an electrically insulating layer on a side of the optoelectronic semiconductor layer sequence facing away from the growth substrate by depositing particles of an electrically insulating material by an aerosol deposition method,
  at least partly removing the growth substrate after forming the electrically insulating layer.

In particular, the side of the semiconductor layer sequence facing away from the growth substrate can be formed by an opposite side of the semiconductor layer sequence relative to the growth substrate. In other words, the side of the semiconductor layer sequence facing away from the growth substrate is formed by the top side of that layer of the semiconductor layer sequence applied last to the growth substrate. The electrically insulating layer can be applied directly on the semiconductor layer sequence by the aerosol deposition method. Furthermore, the electrically insulating layer can also be applied indirectly on the semiconductor layer sequence, that is to say on a layer arranged on the semiconductor layer sequence, for instance a mirror layer.

An optoelectronic semiconductor chip may comprise an electrically insulating layer applied by an aerosol deposition method. The layer applied by an aerosol deposition comprises, in particular, an electrically insulating material which was deposited in the form of particles. The features described above and below apply equally to the method of producing the optoelectronic semiconductor chip and to the optoelectronic semiconductor chip.

In the aerosol deposition method (ADM), a powder of the electrically insulating material may be provided. The size of the particles of the powder can preferably be greater than or equal to 10 nm and less than or equal to 2 μm. In particular, the electrically insulating material can be provided in a powder chamber, which can also be designated as an aerosol chamber and which has a gas feed line and a gas discharge line. By the gas feed line, a gas, preferably an inert gas, for example, helium, nitrogen or else air, can be conducted into the powder chamber. By the gas, some of the particles of the electrically insulating material are conducted as an aerosol in the gas via the gas discharge layer into a coating chamber, which is preferably at a lower pressure than the powder chamber. In particular, the aerosol deposition method can be carried out in the coating chamber at room temperature, that is to say approximately 300 K. By way of example, one or a plurality of filters and/or a classifier to set suitable particle sizes can also be arranged between the powder chamber and the coating chamber. The aerosol comprising the particles of the electrically insulating material emerges in the coating chamber through a nozzle and is directed by the nozzle in a jet-like manner onto an element to be coated, that is to say onto the semiconductor layer sequence. The jet comprising the aerosol can impinge, for example, at points on the semiconductor layer sequence to be coated. Furthermore, the jet comprising the aerosol can also impinge in an expanded manner, in particular, for example, in a linearly fanned out manner, on the semiconductor layer sequence to be coated. The gas of the aerosol acts as an accelerating gas since, via the gas flow, the particles contained therein are sprayed onto the surface to be coated. Preferably, the gas flow and the nozzle geometry are designed such that the particles can be applied with a velocity of greater than or equal to 100 m/s and less than or equal to 500 m/s. The nozzle is moved relative to the substrate to be coated over the substrate to enable the particles to be applied over a large area. This process can also be designated as "scanning."

With the aerosol deposition method, the electrically insulating layer can be produced with desired properties by a targeted choice of the material or materials of the particles, the particle size distribution and the spraying conditions, that is to say, for example, the gas flow and/or the nozzle geometry. In comparison to conventional coating methods such as, for instance, vacuum vapor deposition, chemical vapor deposition, sputtering or ion plating, the aerosol deposition method enables qualitatively and quantitatively efficient application of the electrically insulating material in the form of an unstructured or structured layer. In comparison to sintering methods which involve usually applying dispersant-containing pastes with the desired material particles, the liquid dispersant can be dispensed with in the aerosol deposition method. Furthermore, the aerosol deposition method can be carried out at significantly lower temperatures than a sintering method, in particular even at room temperature, for example, since the energy required for "agglomerating" the particles to form the electrically insulating layer can be provided by the kinetic energy in the gas flow, while in sintering methods the energy required for this purpose is supplied, as is known, by the heating to high temperatures. The aerosol deposition method can thus afford a higher efficiency and a higher process compatibility to produce the electrically insulating layer in comparison to conventional methods in semiconductor technology.

In particular, the following parameters can be particularly suitable for carrying out the aerosol deposition method, wherein the limits of the ranges indicated are included in each case:
pressure in the coating chamber: 0.05 kPa to 2 kPa;
pressure in the aerosol chamber: 10 kPa to 80 kPa;
size of nozzle opening: 5×0.3 mm$^2$; 10×0.4 mm$^2$;
accelerating gas: He, N$_2$, air;
consumption of accelerating gas: 1 l/min to 10 l/min;
temperature of the substrate to be coated during the deposition: 300 K;
coatable area: 40×40 mm$^2$ to 400×400 mm$^2$;
velocity at which the nozzle moves over the substrate to be coated: 0.125 mm/s to 10 mm/s;
distance between the nozzle and the substrate to be coated: 1 mm to 40 mm.

By the aerosol deposition method specified here, deposition rates of a plurality of micrometers per minute are possible at least locally and layer thicknesses of up to 0.1 mm can be effectively realized.

The electrically insulating layer can, in particular, also be used and designed such that topographical differences on the semiconductor layer sequence are compensated for, for instance by more or less electrically insulating material being deposited in a locally apportioned manner. As an alternative thereto, a mechanical planarization step following the aerosol deposition method is also possible if the electrically insulating layer has a sufficient layer thickness for this purpose.

The electrically insulating material may comprise a ceramic material or may be composed thereof. The ceramic material can be selected, for example, from AlN, BN, Al$_2$O$_3$, SiC, BeO, Si$_3$N$_4$ or a mixture thereof. Furthermore, the insulating material can also comprise or be composed of a diamond powder. AlN, BN, SiC, BeO and diamond can be used, in particular, if a high thermal conductivity is intended to be achieved. Al$_2$O$_3$ and Si$_3$N$_4$ can be used, in particular, if the thermal conductivity can also be somewhat lower and a chemically inert layer is desired.

As described above, the aerosol deposition method has the advantage that it can be carried out at room temperature. The electrically insulating layer thus produced preferably has a crystalline or at least polycrystalline structure. As a result, the electrically insulating layer, as also described further below, can have a good thermal conductivity. In particular, by the aerosol deposition method, stable layers can already be produced at room temperature, while conventional layer production methods customary in semiconductor technology typically do not afford the possibility of producing an electrically insulating layer with reliable quality at moderate temperatures, that is to say temperatures in the range of room temperature.

Furthermore, as a result of the use of the aerosol deposition method, the method described here affords new possibilities in the choice of material for the electrically insulating layer. In particular, it is possible to obtain an electrical insulation with at the same time low thermal resistance. In comparison thereto, as described above, the prior art uses, for example, thermal oxide layers on silicon as barrier layers that simultaneously act as a thermal insulation layer on account of the low thermal conductivity of SiO$_2$ glass of approximately 1 W/mK. The thermal insulation is undesirable, however. In contrast thereto, as mentioned above, the aerosol deposition method can produce crystalline layers, preferably without discernible amorphous intermediate layers, which can lead to a good thermal conductivity in the electrically insulating layer. Instead of the SiO$_2$ used in the prior art for electrically insulating layers, it is possible to form an electrically insulating layer made from AlN, for example, the thermal conductivity of which, similarly to a ceramic disk composed of AlN, produced by sintering, for example, can be above 100 W/mK.

The electrically conductive material may comprise particles having different coefficients of thermal expansion. As a result, it can be possible to adapt the coefficient of thermal expansion of the electrically insulating layer in a targeted manner, for example, by a suitable material composition and/ or particle size. As a result, the electrically insulating layer can preferably be adapted to the coefficient of expansion of the semiconductor layer sequence such that during later operation of the optoelectronic semiconductor chip, in accordance with which the latter can heat up, for example, no thermomechanical stresses occur between the electrically insulating layer and the semiconductor layer sequence.

The electrically insulating layer can also comprise at least two layers composed of different electrically insulating materials, for example, the materials mentioned above. By way of example, it is possible to apply a first layer composed of AlN or another of the abovementioned materials having a high thermal conductivity. On this layer, it is possible to apply a second layer composed of $Al_2O_3$ or $Si_3N_4$, for example, having a high chemical resistance. Consequently, the desired properties can be produced for the electrically insulating layer depending on the requirement by a combination of different electrically insulating materials in one layer or in a plurality of layers.

Deposition of the particles of the electrically insulating material can be performed in a structured fashion. By way of example, the deposition method can be carried out selectively by a suitable mask in selected regions on the semiconductor layer sequence such that, in a wafer assemblage, for example, only those regions of the semiconductor layer sequence forming the latter semiconductor chip are provided with the electrically insulating layer.

Singulation of the semiconductor layer sequence may be carried out along singulation lines after the electrically insulating layer has been applied. Particularly preferably, the singulation lines remain free of the electrically insulating material during the process of forming the electrically insulating layer. In this case, the singulation lines can be formed as so-called "separating trenches," for example, which can thus be excluded from an electrical insulation during a selective deposition of the electrically insulating layer.

Prior to singulation, an intermediate carrier material may be molded to the electrically insulating layer, which can be structured, for example, in a molding method, which follows the application. The intermediate carrier material can be a plastics material, for example, molded onto the electrically insulating layer by transfer molding, injection molding or compression molding. The intermediate carrier material can facilitate in particular a handling of the semiconductor layer sequence with the electrically insulating layer, in particular for singulation. After singulation, the intermediate carrier material can be at least partly removed such that the electrically insulating layer can be at least partly exposed after singulation. Removal of the intermediate carrier material for the at least partial exposure of the electrically insulating layer can be effected by grinding, for example.

Before the electrically insulating layer is formed, a mirror layer, as described further above, may be applied to the optoelectronic semiconductor layer sequence. The electrically insulating layer is subsequently applied on that side of the mirror layer facing away from the semiconductor layer sequence.

A metal layer may be applied on the mirror layer, on which metal layer the electrically insulating layer is then subsequently formed. In particular, the metal layer can be applied by an electroplating method, for example. The metal layer can comprise copper and/or silver, for example, and have a thickness of up to 100 µm. In particular, the metal layer can be applied in a structured manner in regions which form the optoelectronic semiconductor chips after singulation of the semiconductor layer sequence which is carried out after the electrically insulating layer has been applied. In other words, the metal layer can be applied on surface regions separated from one another and which define the regions of the semiconductor layer sequence which form individual optoelectronic semiconductor chips after singulation. In particular, the metal layer can be enclosed by the electrically insulating layer. Particularly preferably, the metal layer is hermetically enveloped by the electrically insulating layer. By way of example, the metal layer, in the case of a thickness of up to 100 µm, can form metal pedestals hermetically enveloped by the electrically insulating layer by virtue of the subsequently performed aerosol deposition of forming the electrically insulating layer. Consequently, by way of example, a material sensitive to environmental conditions, for example, silver, can be used for the metal layer. For the hermetic sealing, the electrically insulating layer can preferably comprise AlN and/or $Al_2O_3$.

The electrically insulating layer may form a carrier element for the optoelectronic semiconductor layer sequence. That means that the electrically insulating layer has a thickness such that the completed optoelectronic semiconductor chip or the semiconductor layer sequence of the completed optoelectronic semiconductor chip can be carried by the electrically insulating layer. For this purpose, the electrically insulating layer can have a thickness of approximately 0.1 mm, for example.

The electrically insulating layer may be an electrical insulation layer arranged between the semiconductor layer sequence and an additionally applied carrier element. By way of example, the electrically insulating layer can have a thickness of approximately 10 µm in this case.

A connecting layer may be applied on that side of the electrically insulating layer facing away from the semiconductor layer sequence. The connecting layer can be formed, for example, by one or a plurality of metal layers or by an adhesive layer. When the electrically insulating layer is a carrier element, it is possible to provide the connecting layer made from one or a plurality of metal layers or made from an adhesive layer on the electrically insulating layer to be able to mount the optoelectronic semiconductor chip on a carrier, for example, a printed circuit board, a housing or a ceramic substrate. If the electrically insulating layer is an electrical insulation layer and not a carrier element, a carrier element can be applied in particular on the connecting layer on the electrically insulating layer. By way of example, the carrier element can be composed of silicon and applied by soldering or adhesive bonding in a joining process. As an alternative thereto, it is also possible for the connecting layer to comprise one or a plurality of metal layers to which, as the carrier element, a metallic reinforcement layer is applied by an electroplating method or a spraying method, in particular by cold plasma coating. In this case, the metallic reinforcement layer can be formed from copper and/or nickel, for example.

In the case of the method described here and the optoelectronic semiconductor chip described here, it is advantageously possible that, by the aerosol deposition method, as a result of the deposition of particles of the electrically insulating material, an electrically insulating layer is produced on the semiconductor layer sequence, which can be formed either as a fully adequate replacement carrier or carrier element or else as a sufficiently thick electrical barrier layer such that, in accordance with some examples, it is possible to completely dispense with so-called "wafer bonding" to apply an additional carrier element as a replacement carrier. In particular, thick insulation layers that afford sufficient reliability can be deposited rapidly in the form of the electrically insulating layer.

Further advantages will become apparent from the examples described below in conjunction with the figures.

In the examples and figures, elements that are identical, of identical type or act identically may be provided in each case with the same reference signs. The illustrated elements and their size relationships among one another should not be regarded as true to scale. Rather, individual elements such as layers, structural parts, components and regions, for example, may be illustrated with an exaggerated size to enable better illustration and/or to afford a better understanding.

FIGS. 1A to 1E show one example of a method of producing an optoelectronic semiconductor chip 101.

Figure 1A:
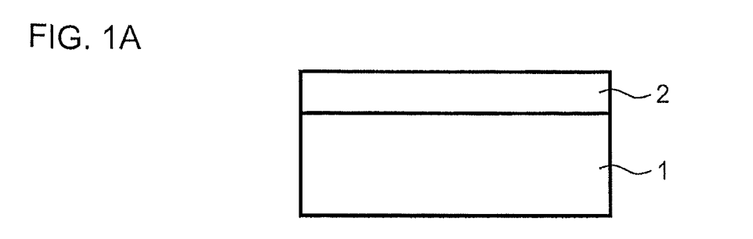
FIGS. 1A to 1E show schematic illustrations of method steps of a method of producing an optoelectronic semiconductor chip in accordance with one example.

A first method step in accordance with FIG. 1A involves providing a growth substrate 1 on which an optoelectronic semiconductor layer sequence 2 is grown. In this example and in the further examples, the optoelectronic semiconductor layer sequence 2 is, purely by way of example, a light-emitting semiconductor layer sequence having an active region which emits light during the operation of the optoelectronic semiconductor chip 101. The semiconductor layer sequence 2 can have features in accordance with the description in the general part. In particular, in the example shown, the semiconductor layer sequence 2 is based on a nitride compound semiconductor material, a phosphide compound semiconductor material or an arsenide compound semiconductor material. The growth substrate 1 can accordingly comprise or be composed of, for example, sapphire, GaAs, GaP, GaN, InP, SiC, Si and/or Ge.

Figure 1B:
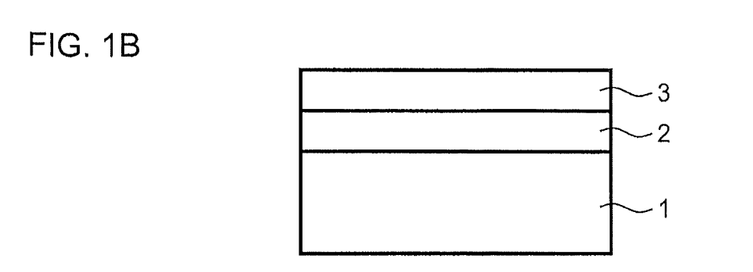

In a further method step in accordance with FIG. 1B, a mirror layer 3 is applied on that side of the semiconductor layer sequence 2 facing away from the growth substrate 1, which mirror layer can comprise silver or consist thereof.

Figure 1C:
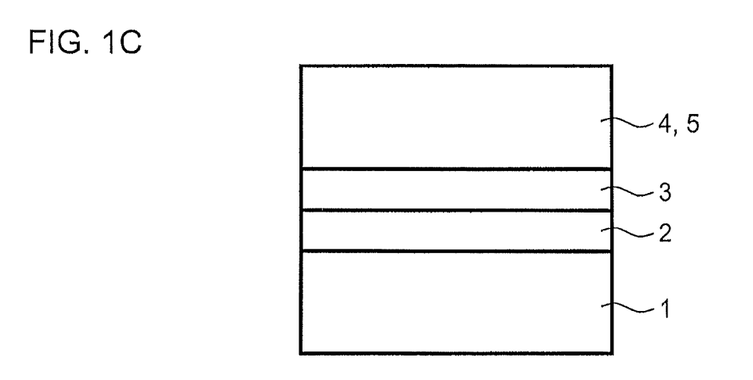

In a further method step in accordance with FIG. 1C, instead of an otherwise customary joining step to mount a replacement carrier, an electrically insulating layer 4 as carrier element 5 is applied on the mirror layer 3 on that side of the semiconductor layer sequence 2 facing away from and, in particular, is situated opposite the growth substrate. For this purpose, the growth substrate 1 with the optoelectronic semiconductor layer sequence 2 arranged thereon and the mirror layer 3 applied thereabove is arranged in a coating chamber into which an aerosol is sprayed by a nozzle. The aerosol contains particles of an electrically insulating material, which particles are sprayed onto the mirror layer 3 through a gas, which can also be designated as an accelerating gas or carrier gas.

For this purpose, a powder comprising the particles of the electrically insulating material is provided in a powder or aerosol chamber, the powder having grain sizes in the range of greater than or equal to 10 nm and less than or equal to 2 μm, depending on the desired properties of the electrically insulating layer 4. As a result of the gas being fed into the aerosol chamber, which gas can be helium, nitrogen or air, for example, the particles of the electrically insulating material are distributed in the gas and can thus be fed to the coating chamber as an aerosol. In this case, a filter that eliminates contaminants and/or a filter that selects a specific particle size (classifier) can, for example, also be present between the aerosol chamber and the coating chamber. The process parameters in this case can be, for example, the process parameters described above in the general part. In particular, the aerosol deposition method is carried out at room temperature, that is to say at a temperature of the semiconductor layer sequence 2 and of the mirror layer 3 of approximately 300 K. The gas flow of the carrier gas and also the nozzle geometry are chosen such that the particles of the aerosol are applied with a velocity of approximately greater than or equal to 100 m/s and less than or equal to 500 m/s. Particularly preferably, the jet with the aerosol is expanded, in particular fanned out linearly. By virtue of a relative movement of the nozzle along the main extension plane of the semiconductor layer sequence 2 or of the mirror layer 3, that is to say parallel thereto, an insulating layer composed of AlN and having a thickness of approximately 0.1 mm in the example shown is applied over the whole area by scanning. The layer is thick and stable enough to form a carrier element 5 for an optoelectronic semiconductor chip 101 completed later.

As an alternative thereto, a diamond powder, for example, can also be provided as the electrically insulating material such that the electrically insulating layer can, for example, also be applied as a diamond layer having a particularly good thermal conductivity. As an alternative thereto, another of the materials mentioned above in the general part or a combination thereof is also possible.

Figure 1D:
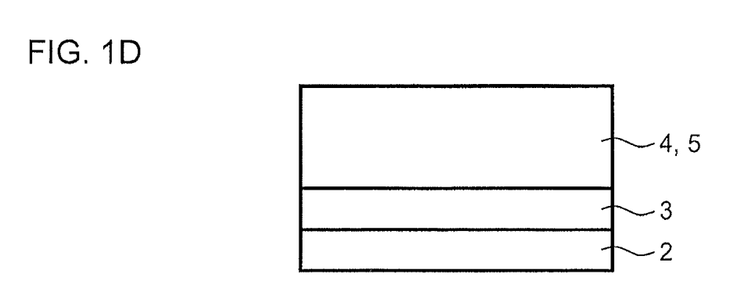

A further method step in accordance with FIG. 1D involves removing the growth substrate 1 such that the semiconductor layer sequence 2 is exposed. The growth substrate 1 can be detached, for example, by a known laser lift-off method.

Figure 1E:
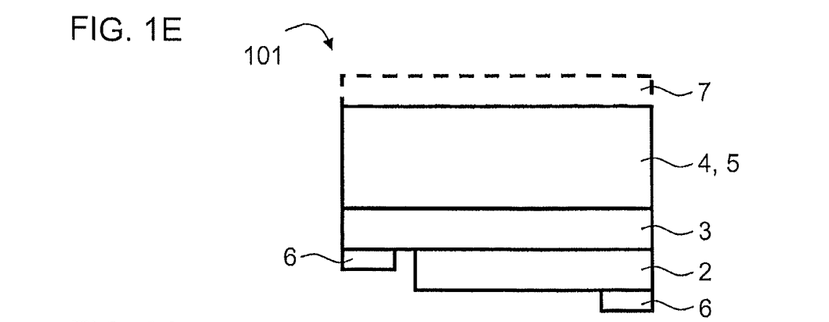

In a further method step in accordance with FIG. 1E, electrical contact regions 6 to contact the optoelectronic semiconductor layer sequence 2 are applied on the exposed side. For this purpose, as shown in FIG. 1E, for example, a part of the semiconductor layer sequence 2 can also be structured such that, via the mirror layer 3, contact can be made with that side of the semiconductor layer sequence 2 facing the electrically insulating layer 4. Furthermore, it can also be possible to arrange electrical contact regions on the same side of the semiconductor layer sequence 2 and to make contact with one of the contact regions through a plated-through hole through the semiconductor layer sequence 2 with that side of the semiconductor layer sequence 2 facing away from the contact regions. The optoelectronic semiconductor chip 101 shown in FIG. 1E can be, in particular, a thin-film semiconductor chip described above in the general part.

As is indicated by the dashed line, a connecting layer 7 can be applied on that side of the electrically insulating layer 4 facing away from the semiconductor layer sequence 2, by which connecting layer the completed optoelectronic semiconductor chip 101 can be applied, for example, on a carrier, for instance a leadframe, a housing or a ceramic substrate. The connecting layer 7 can comprise an adhesive layer, for example. If the optoelectronic semiconductor chip 101 is intended to be soldered or mounted by silver sintering, as the connecting layer 7 preferably a metal layer or a metal layer sequence is applied, for example, a layer sequence comprising Ti/Ni/Ag, which can be applied by vapor deposition.

Although manufacture of the optoelectronic semiconductor chip 101 is shown by way of example on the basis of an individual semiconductor chip, it is also possible, in particular, to produce an assemblage of semiconductor chips in a wafer-based method such that individual semiconductor chips can be detached from the wafer assemblage by singulation.

FIGS. 2A to 2E show a further example of a method of producing an optoelectronic semiconductor chip 102.

Figure 2A:
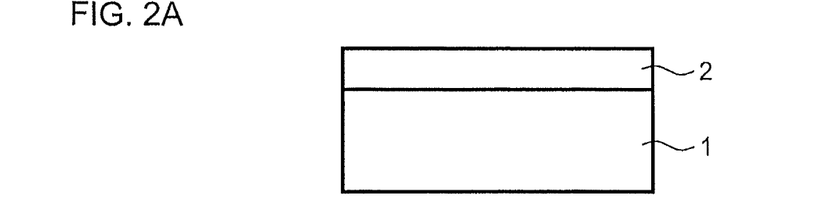
FIGS. 2A to 2E show schematic illustrations of method steps of a method of producing an optoelectronic semiconductor chip in accordance with a further example.
Figure 2B:
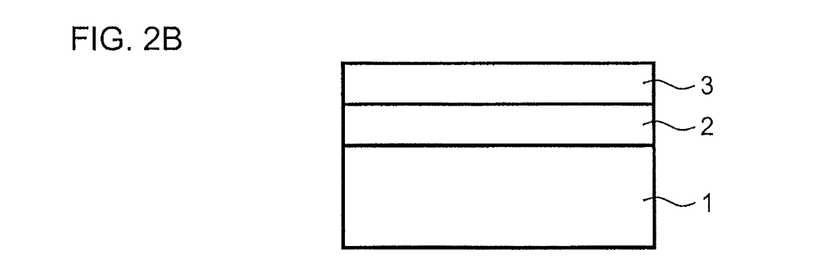

The method steps shown in FIGS. 2A and 2B and involving applying on a growth substrate 1 an optoelectronic semiconductor layer sequence 2 and a mirror layer 3 thereabove correspond in this case to the method steps of the previous example.

Figure 2C:
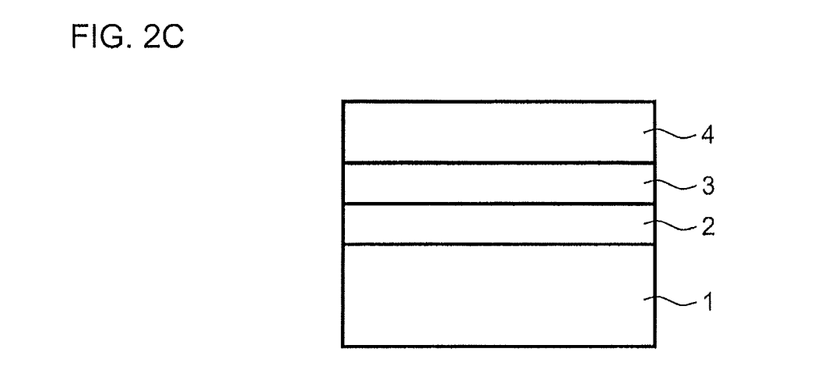

In a further method step in accordance with FIG. 2C, an electrically insulating layer 4 is applied by an aerosol deposition method, wherein a method such as has been described in conjunction with the previous example can be used for this purpose, for example. In comparison to the example in FIGS. 1A to 1E, however, the electrically insulating layer 4 is applied in the form of an electrical insulation layer having a thickness of approximately 10 μm. The electrically insulating layer 4 is produced from AlN or from BN, for example. A thickness of approximately 10 μm suffices to achieve a sufficiently reliable insulating effect by the electrically insulating layer 4 and, for example, also to compensate for topographical differences on the semiconductor layer sequence 2 and/or the mirror layer 3. On the basis of the breakdown strength of the material respectively produced, the electrically insulating layer 4 can also be controlled with regard to its thickness and can also be smaller or larger than 10 μm, for example.

Figure 2D:
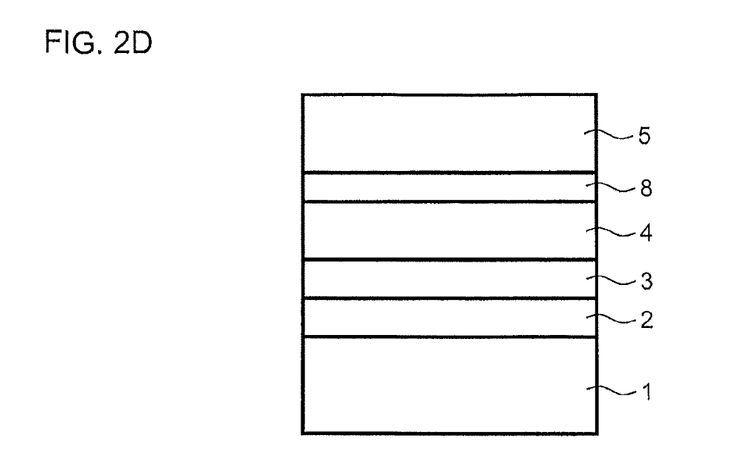

A further method step in accordance with FIG. 2D involves applying a connecting layer 8 on the electrically insulating layer 4 and a carrier element 5 on the connecting layer. The connecting layer 8 can be formed by a thin metal layer, for example, which serves as preparation for an electroplating method such that a reinforcement layer is subsequently applied as a carrier element 5 on the connecting layer 8 by electroplating. By way of example, copper or, if the thermal conductivity is of lesser interest, nickel can be used as material for the carrier element 5. Alternatively, the carrier element 5 can also be applied in the form of a metallic reinforcement layer by a conventional spraying method or, for example, by cold plasma coating in a cold-active atmospheric plasma.

Alternatively, the carrier element 5 can also be applied by soldering or adhesive bonding, for example. In the case of soldering, the connecting layer 8 can be formed by a solderable metal layer and a solder. In the case of an adhesive-bonding connection, the connecting layer 8 can be formed by an adhesive layer. As the carrier element 5, by way of example, it is possible to use silicon as a replacement carrier in these cases. Such a carrier element has the advantage that during later singulation it is not necessary to use any processes of separation by grinding or etching processes, rather plasma etching can be used.

Figure 2E:
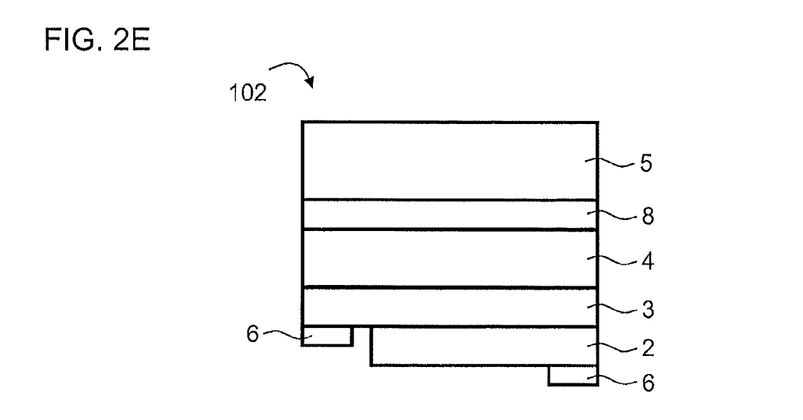

In further method steps, as in the previous example, the growth substrate 1 is removed and electrical contact regions 6 are applied on the exposed side of the semiconductor layer sequence 2 and/or of the mirror layer 3, as a result of which, if appropriate after a singulation step, the optoelectronic semiconductor chip 102 shown in FIG. 2E is completed. As described in conjunction with the previous example, yet another connecting layer can be applied on that side of the carrier element 5 facing away from the semiconductor layer sequence 2 to be able to mount the optoelectronic semiconductor chip 102 onto a carrier.

FIGS. 3A to 3F show a further example of a method of producing an optoelectronic semiconductor chip 103.

Figure 3A:
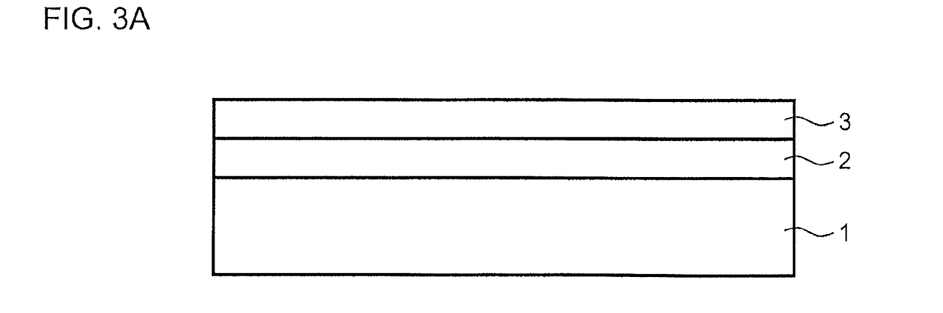
FIGS. 3A to 3F show schematic illustrations of method steps of a method of producing an optoelectronic semiconductor chip in accordance with a further example.

As is shown in FIG. 3A, as in the case of the previous examples, a semiconductor layer sequence 2 is applied over a large area on a growth substrate 1 and a mirror layer 3 is applied above the semiconductor layer sequence.

Figure 3B:
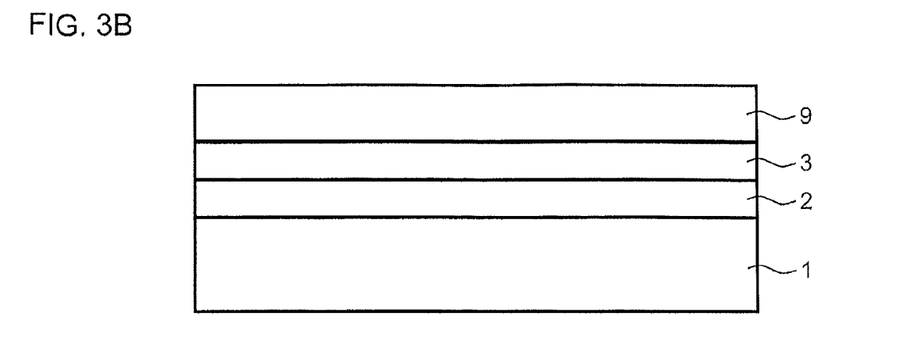

In a further method step in accordance with FIG. 3B, a metal layer 9 is applied on that side of the mirror layer 3 facing away from the growth substrate 1, for example, by an electroplating method. In this case, the metal layer 9 can have a thickness of up to 100 μm and comprise or consist of a metal having a high thermal conductivity, for example, copper or silver.

Figure 3C:
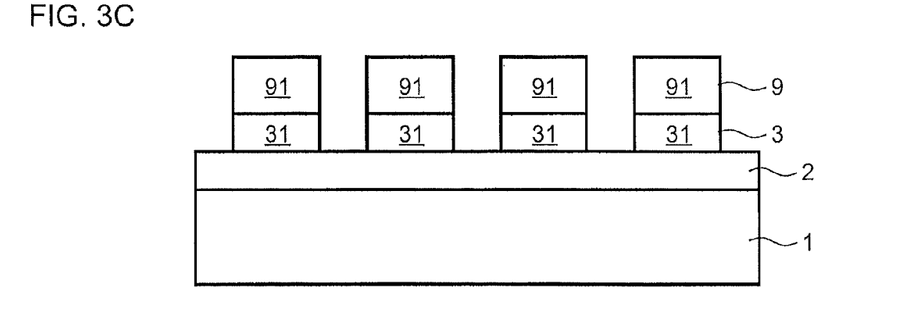

As is shown in FIG. 3C, the mirror layer 3 and the metal layer 9 are subsequently structured into mirror layer regions 31 and metal layer regions 91. Alternatively, it is also possible, for example, to apply structured metal layer regions 91 on the mirror layer 3 and subsequently to structure the mirror layer 3 into the mirror layer regions 31. In this case, the metal layer regions 91 are arranged in regions which form the optoelectronic semiconductor chips 103 after singulation of the semiconductor layer sequence 2, as shown in a later method step.

Figure 3D:
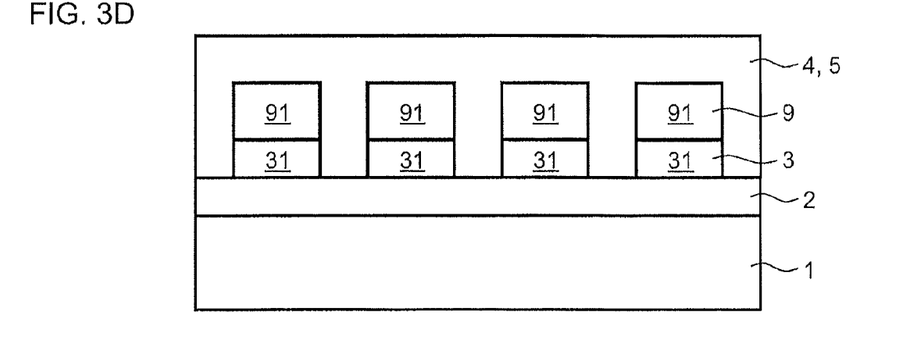

In a further method step in accordance with FIG. 3D, the mirror layer regions 31 and the metal layer regions 91 are enclosed with an electrically insulating layer 4 applied by aerosol deposition and are thus hermetically enveloped by the electrically insulating layer. For this purpose, AlN, in particular, is suitable as electrically insulating material for the electrically insulating layer 4, which is simultaneously a carrier element 5 for the semiconductor chips 103 completed later. If the thermal conductivity is less important than a chemical resistance, for example, the electrically insulating layer 4 can also be produced from $Al_2O_3$ or $Si_3N_4$, for example. Furthermore, it is also possible for the electrically insulating layer 4 to comprise at least two layers, for example, an AlN layer, to which a coating comprising an $Al_2O_3$ layer or an $Si_3N_4$ layer is applied. Such insulating layers or layer combinations can be applied efficiently by the aerosol deposition method described here. Alternatively, it is also possible to apply a coating comprising an $Al_2O_3$ layer or an $Si_3N_4$ layer to the electrically insulating layer 4 by a different method than aerosol deposition, for example, by chemical vapor deposition (CVD).

Figure 3E:
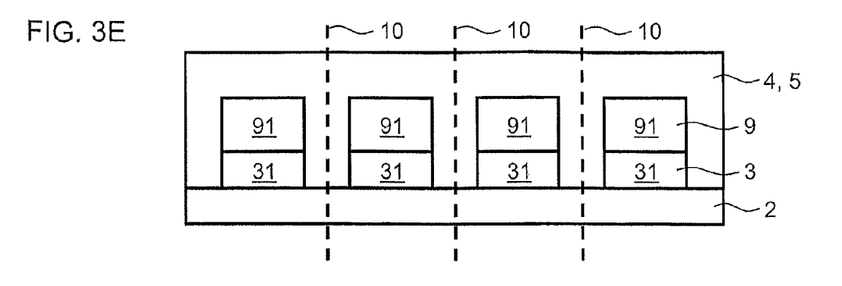
Figure 3F:
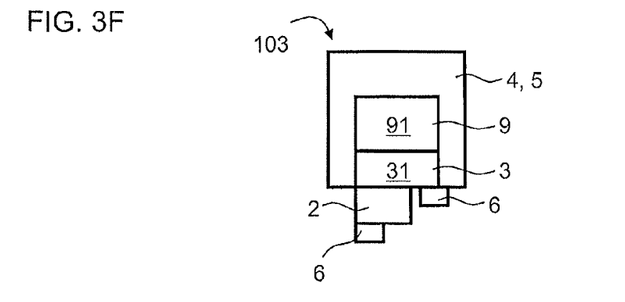

In a further method step in accordance with FIG. 3E, the growth substrate 1 is detached. Along singulation lines 10 shown schematically, the assemblage shown in FIG. 3E is singulated to form individual optoelectronic semiconductor chips 103, as shown in FIG. 3F. As already described in conjunction with the previous examples, electrical contact regions 6 are also applied on that side of the semiconductor layer sequence 2 exposed as a result of the detachment of the growth substrate 1.

The optoelectronic semiconductor chip 103 shown in FIG. 3F therefore comprises a semiconductor layer sequence 2 on a mirror layer 3, wherein a metal layer 9 is arranged on a side of the mirror layer 3 facing away from the semiconductor layer sequence 2 and the mirror layer 3 and the metal layer 9 are enclosed by the electrically insulating layer 4 applied by an aerosol deposition method. In particular, the electrically insulating layer 4 applied by aerosol deposition is applied on the side surfaces of the mirror layer 3 and of the metal layer 9 and on the rear-side surface of the metal layer 9 situated opposite the semiconductor layer sequence 2.

FIGS. 4A to 4H show a further example of a method of producing optoelectronic semiconductor chips 104.

Figure 4A:
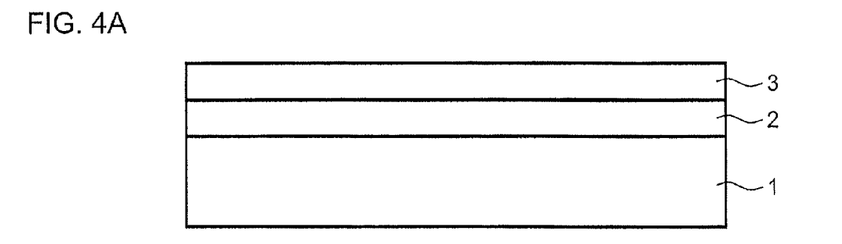
FIGS. 4A to 4H show schematic illustrations of method steps of a method of producing optoelectronic semiconductor chips in accordance with a further example.

As in the previous examples, as is shown in FIG. 4A, a semiconductor layer sequence 2 is applied on a growth substrate 1 and a mirror layer 3 is applied thereabove.

Figure 4B:
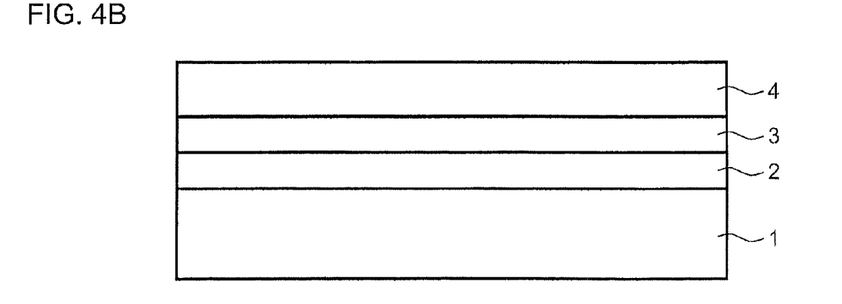

In a further method step in accordance with FIG. 4B, an electrically insulating layer 4 is applied on the mirror layer 3 by an aerosol deposition method, which can be implemented, for example, as in conjunction with the example in FIGS. 1A to 1E. In particular, the electrically insulating layer 4 is applied with a thickness such that it can function as a carrier element 5 for the optoelectronic semiconductor chips 104 completed later.

Figure 4C:
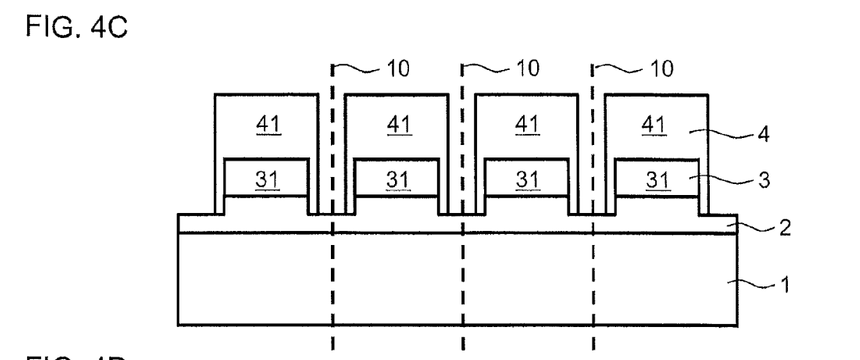

In a further method step in accordance with FIG. 4C, the electrically insulating layer 4, the mirror layer 3 and at least partly the semiconductor layer sequence 2 are structured into regions which correspond to the optoelectronic semiconductor chips 104, completed later. The sides of the exposed regions of the semiconductor layer sequence 2 and of the mirror layer regions 31 can additionally be covered with the material of the electrically insulating layer 4. Alternatively, it is also possible firstly to structure the mirror layer and, if appropriate, also the semiconductor layer sequence 2 and only afterward to apply the electrically insulating layer in the form of the layer regions 41.

Instead of an otherwise customary joining step to mount a replacement carrier, therefore, in the method shown here, ceramic pedestals or ceramic bases in the form of the layer regions 41 are applied in a localized manner to the regions or the core surfaces of the later semiconductor chip 104 by aerosol deposition. The ceramic bases are advantageously produced from a ceramic having a high thermal conductivity, for example, AlN and extend over in each case the entire later semiconductor chip 104.

Figure 4D:
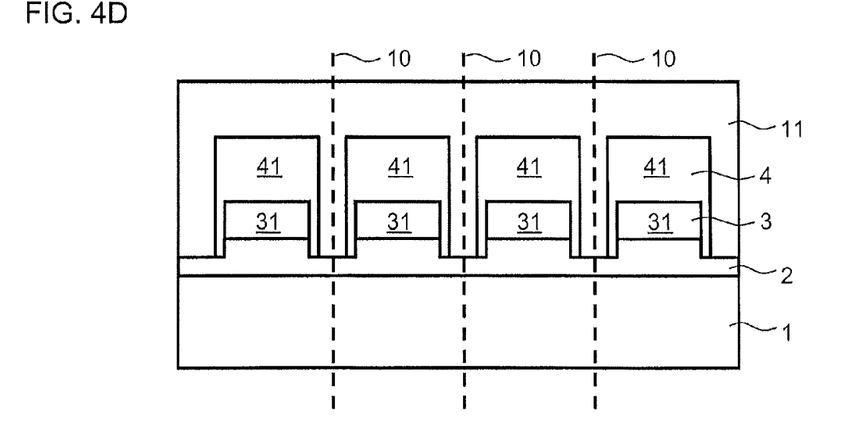

To achieve a sufficient stability for the further processing of the assemblage, an intermediate carrier material, for instance a plastics material, is molded to the electrically insulating layer in the form of the layer regions 41 in a molding method, as shown in FIG. 4D. By way of example, the intermediate carrier material 11 can be applied by a transfer molding method. The intermediate carrier material 11 can act, in particular, as a temporary stabilization carrier.

Figure 4E:
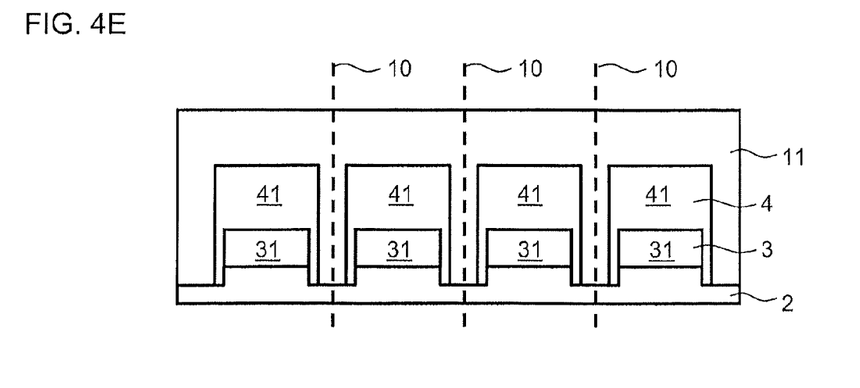
Figure 4F:
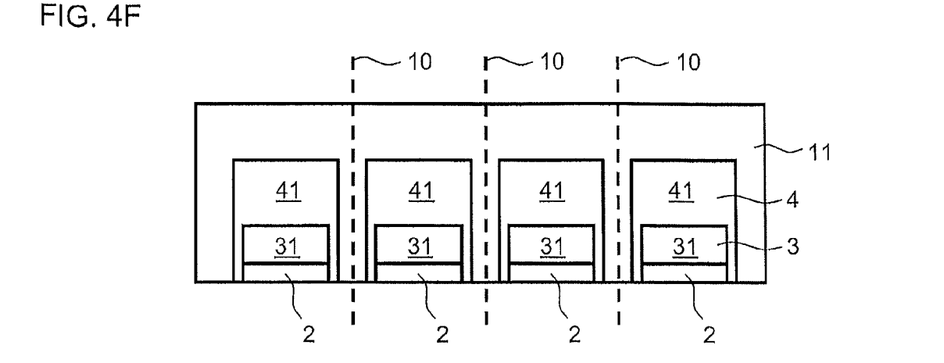

In a further method step in accordance with FIG. 4E, the growth substrate 1 is removed. Afterward, the semiconductor layer sequence 2 is structured in a further method step, as shown in FIG. 4F, to an extent such that preferably those parts of the semiconductor layer sequence 2 which project beyond the layer regions 41 are removed.

Figure 4G:
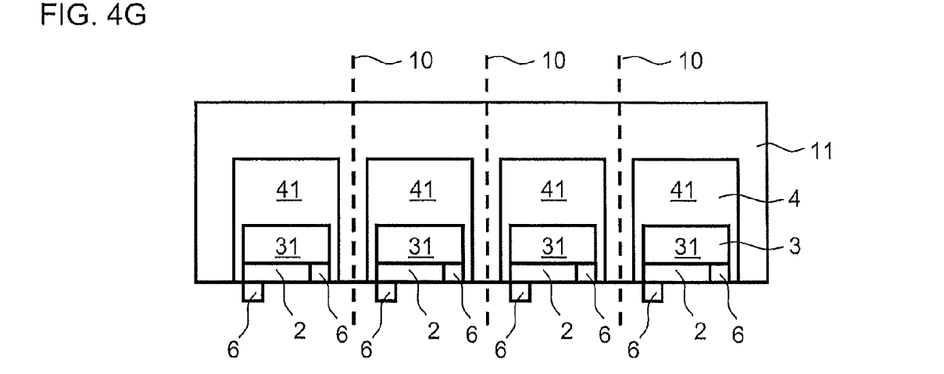

In a further method step in accordance with FIG. 4G, as described in the previous examples, electrical contact regions 6 are applied to the exposed side of the semiconductor layer sequence 2 and to an exposed region of the mirror layer regions 31.

Figure 4H:
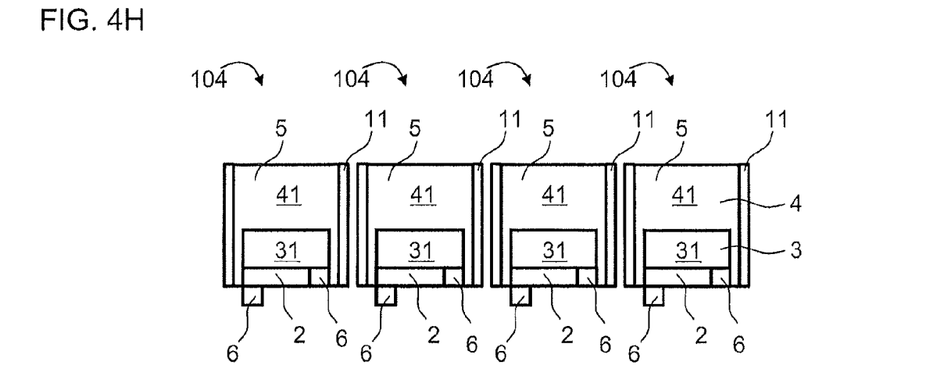

Afterward, the assemblage, as shown in FIG. 4H, is singulated by a grinding step. In this case, the layer regions 41 of the electrically insulating layer, which form the carrier elements 5 in the form of ceramic bases for the optoelectronic semiconductor chips 104 thus produced, are at least partly exposed.

The optoelectronic semiconductor chip 104 shown in FIG. 4H thus comprises a semiconductor layer sequence 2 on a mirror layer 3, wherein a base as a carrier element 5 in the form of the electrically insulating layer 4 applied by aerosol deposition is arranged on a side of the mirror layer 3 facing away from the semiconductor layer sequence 2. The base in the form of the electrically insulating layer 4 applied by aerosol deposition also covers the side surfaces of the mirror layer 3 and of the semiconductor layer sequence 2 and thus encloses them. Side surfaces of the base can be covered with the intermediate carrier material 11, as shown in FIG. 4H.

In the case of the examples described here, the electrically insulating layers 4 respectively shown can be produced from one material, from a plurality of layers comprising different materials or else from one or a plurality of layers comprising different materials in each case. Furthermore, it is also possible, to produce the electrically insulating layers 4 shown, to use particles of the electrically insulating material having different coefficients of thermal expansion such that the thermal expansion of the electrically insulating layer 4 can be adapted to the expansion requirements of the respective semiconductor layer sequence 2.

In the case of the methods described here, it is also possible to apply the electrically insulating layer 4 in each case not over a large area, but rather in a structured manner only in the regions which correspond to the semiconductor chips 101, 102, 103, 104 completed later such that the regions in which singulation takes place in each case remain free of the electrically insulating layer 4.

The methods and optoelectronic semiconductor chips shown in the examples can comprise further or alternative features, as described in the general part.

Our methods and chips not restricted to the examples by the description on the basis of the examples. Rather, this disclosure encompasses any novel feature and also any combination of features, which in particular includes any combination of features in the appended claims, even if the feature or combination itself is not explicitly specified in the claims or examples.

The invention claimed is:

1. A method of producing an optoelectronic semiconductor chip comprising:
   growing an optoelectronic semiconductor layer sequence on a growth substrate;
   forming an electrically insulating layer on a side of the optoelectronic semiconductor layer sequence facing away from the growth substrate by depositing particles of an electrically insulating material by an aerosol deposition method; and
   at least partly removing the growth substrate after forming the electrically insulating layer,
   wherein, before the process of forming the electrically insulating layer, a mirror layer is applied to the optoelectronic semiconductor layer sequence, and the electrically insulating layer is applied on that side of the mirror layer facing away from the semiconductor layer sequence.

2. The method according to claim 1, wherein the electrically insulating material comprises a ceramic material.

3. The method according to claim 1, wherein the electrically insulating material is at least one selected from the group consisting of AlN, BN, $Al_2O_3$, BeO, SiC, $Si_3N_4$ and a diamond powder.

4. The method according to claim 1, wherein the electrically insulating material comprises particles having different coefficients of thermal expansion.

5. The method according to claim 1, wherein the aerosol deposition method is carried out at room temperature.

6. The method according to claim 1, wherein the semiconductor layer sequence is singulated into individual semiconductor chips after the electrically insulating layer has been applied.

7. The method according to claim 6, wherein the singulation is carried out along singulation lines which remain free of the electrically insulating material during the process of forming the electrically insulating layer.

8. The method according to claim 6, wherein, before singulation, an intermediate carrier material is molded to the electrically insulating layer in a molding method, and the electrically insulating layer is at least partly exposed by at least partial removal of the intermediate carrier material after singulation.

9. The method according to claim 1, wherein a metal layer is applied to the mirror layer, the electrically insulating layer is formed on the metal layer, and the metal layer is formed in a structured manner in regions which form the optoelectronic semiconductor chips after singulation of the semiconductor layer sequence, and which is carried out after the electrically insulating layer has been applied.

10. The method according to claim 9, wherein free surfaces of the metal layer are enclosed by the electrically insulating layer.

11. The method according to claim 1, wherein the electrically insulating layer is a carrier element for the semiconductor chip.

12. The method according to claim 1, wherein a connecting layer is applied on a side of the electrically insulating layer facing away from the semiconductor layer sequence, the connecting layer being formed by one or a plurality of metal layers or by an adhesive layer.

13. The method according to claim 12, wherein a carrier element is applied on the connecting layer.

14. The method according to claim 13, wherein the carrier element is composed of silicon.

15. The method according to claim 12, wherein the connecting layer is formed by one or a plurality of metal layers to which, as carrier element, a metallic reinforcement layer is applied by an electroplating method or by a spraying method.

16. The method according to claim 15, wherein the spraying method is cold plasma coating.

17. An optoelectronic semiconductor chip comprising a semiconductor layer sequence on a mirror layer, wherein a metal layer is arranged on a side of the mirror layer facing away from the semiconductor layer sequence, and free surfaces of the mirror and metal layers are enclosed by an electrically insulating layer applied by an aerosol deposition method.

18. The semiconductor chip according the claim 17, wherein the electrically insulating layer comprises a ceramic material.

19. A method of producing an optoelectronic semiconductor chip comprising:
   growing an optoelectronic semiconductor layer sequence on a growth substrate;
   forming an electrically insulating layer on a side of the optoelectronic semiconductor layer sequence facing away from the growth substrate by depositing particles of an electrically insulating material by an aerosol deposition method; and
   at least partly removing the growth substrate after forming the electrically insulating layer,
   wherein the semiconductor layer sequence is singulated into individual semiconductor chips after the electrically insulating layer has been applied, and
   wherein, before singulation, an intermediate carrier material is molded to the electrically insulating layer in a molding method, and the electrically insulating layer is at least partly exposed by at least partial removal of the intermediate carrier material after singulation.

* * * * *